United States Patent
Hellweg

(10) Patent No.: US 12,353,141 B2
(45) Date of Patent: Jul. 8, 2025

(54) METHOD FOR HEATING AN OPTICAL ELEMENT IN A MICROLITHOGRAPHIC PROJECTION EXPOSURE APPARATUS AND OPTICAL SYSTEM

(71) Applicant: Carl Zeiss SMT GmbH, Oberkochen (DE)

(72) Inventor: Dirk Hellweg, Langenau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 145 days.

(21) Appl. No.: 18/342,377

(22) Filed: Jun. 27, 2023

(65) Prior Publication Data

US 2023/0350312 A1    Nov. 2, 2023

Related U.S. Application Data

(63) Continuation of application No. PCT/EP2021/080878, filed on Nov. 8, 2021.

(30) Foreign Application Priority Data

Feb. 10, 2021    (DE) .......................... 102021201258.2

(51) Int. Cl.
  *G03F 7/00*      (2006.01)
  *G02B 5/08*      (2006.01)
(52) U.S. Cl.
  CPC ....... *G03F 7/70891* (2013.01); *G02B 5/0891* (2013.01); *G03F 7/70266* (2013.01)
(58) Field of Classification Search
  CPC ............. G03F 7/70891; G03F 7/70958; G03F 7/7015; G03F 7/702; G03F 7/70233;
  (Continued)

(56) References Cited

U.S. PATENT DOCUMENTS

| | | | | |
|---|---|---|---|---|
| 2005/0140947 A1* | 6/2005 | Miyajima | ........... | G03F 7/70891 |
| | | | | 355/53 |
| 2006/0028627 A1* | 2/2006 | Box | ........................ | G03F 7/708 |
| | | | | 355/53 |

(Continued)

FOREIGN PATENT DOCUMENTS

| | | | |
|---|---|---|---|
| DE | 10 2008 002 403 A1 | 12/2009 | |
| DE | 10 2012 216 284 A1 | 3/2013 | |

(Continued)

OTHER PUBLICATIONS

Translation of International Preliminary Report on Patentability for corresponding PCT Appl No. PCT/EP2021/080878, dated Aug. 24, 2023.

(Continued)

*Primary Examiner* — Deoram Persaud
(74) *Attorney, Agent, or Firm* — Fish & Richardson P.C.

(57) ABSTRACT

A method of heating an optical element in a microlithographic projection exposure apparatus and an optical system includes using a heating arrangement to introduce a heating power into the optical element. The heating power is regulated based on a setpoint value. The setpoint value is varied over time during the operation of the projection exposure apparatus. Varying the setpoint value for the heating power comprises a simulation of the effects of changes in the heating power relative to the actual value thereof based on a model for the thermal behavior of the optical element.

20 Claims, 3 Drawing Sheets

(58) Field of Classification Search
CPC .............. G03F 7/70316; G03F 7/70825; G03F 7/70266; G03F 7/705; G03F 7/70525; G02B 7/1815; G02B 5/0816; G02B 5/0891; G02B 17/0647; G02B 27/0025; G02B 27/0043; G02B 3/00; G02B 5/00; G02B 5/08; G02B 17/0832; G02B 23/02; G02B 27/0944; G02B 27/095; G02B 3/0056; G02B 5/3075; G02B 6/102; G02B 6/262; G02B 7/003; G02B 7/181; H05B 2203/032; H05B 3/84; G03B 27/542

See application file for complete search history.

(56) References Cited

U.S. PATENT DOCUMENTS

| | | | |
|---|---|---|---|
| 2011/0222144 A1 | 9/2011 | Enkisch et al. | |
| 2013/0077074 A1 | 3/2013 | Major et al. | |
| 2013/0141707 A1* | 6/2013 | Baer | G03F 7/702 |
| | | | 359/838 |
| 2016/0041480 A1 | 2/2016 | Hauf | |
| 2016/0342097 A1 | 11/2016 | Conradi et al. | |
| 2018/0275525 A1* | 9/2018 | Bow | G03F 7/70875 |
| 2020/0026195 A1 | 1/2020 | Lippert et al. | |
| 2021/0041790 A1 | 2/2021 | DeRapper et al. | |
| 2022/0299732 A1 | 9/2022 | Berner et al. | |
| 2023/0273529 A1* | 8/2023 | Khedekar | G03F 7/705 |
| | | | 430/22 |
| 2023/0315027 A1* | 10/2023 | Van Berkel | G06N 3/084 |
| | | | 700/48 |
| 2025/0102920 A1* | 3/2025 | Langenhorst | G02B 27/0043 |

FOREIGN PATENT DOCUMENTS

| | | |
|---|---|---|
| DE | 10 2013 204 427 A1 | 9/2014 |
| DE | 10 2017 207 862 A1 | 7/2017 |
| DE | 10 2017 205 405 A1 | 10/2018 |
| DE | 10 2018 208 653 A1 | 12/2019 |
| DE | 10 2019 202 531 A1 | 2/2020 |
| DE | 10 2019 219 289 A1 | 6/2021 |
| DE | 10 2020 209 141 A1 | 1/2022 |
| DE | 10 2021 100 995 A1 | 7/2022 |
| EP | 1 531 364 B1 | 7/2013 |
| EP | 2 598 947 B1 | 4/2020 |
| WO | WO 2009/046955 A2 | 4/2009 |
| WO | WO 2022/028709 A1 | 2/2022 |

OTHER PUBLICATIONS

Translation of International Search Report for corresponding PCT Appl No. PCT/EP2021/080878, dated Feb. 23, 2022.
GPTO-Office Action, with translation thereof, for corresponding DE 10 2021 201 258.2 dated Jul. 27, 2021.

* cited by examiner

METHOD FOR HEATING AN OPTICAL ELEMENT IN A MICROLITHOGRAPHIC PROJECTION EXPOSURE APPARATUS AND OPTICAL SYSTEM

CROSS-REFERENCE TO RELATED APPLICATIONS

The present application is a continuation of, and claims benefit under 35 USC 120 to, international application PCT/EP2021/080878, filed Nov. 8, 2021, which claims benefit under 35 USC 119 of German Application No. 10 2021 201 258.2, filed Feb. 10, 2021. The entire disclosure of each these applications is incorporated by reference herein.

FIELD

The disclosure relates to a method for heating an optical element in a microlithographic projection exposure apparatus, and to an optical system.

BACKGROUND

Microlithography is used for producing microstructured components, such as for example integrated circuits or LCDs. The microlithography process is carried out in what is known as a projection exposure apparatus, which has an illumination device and a projection lens. The image of a mask (=reticle) illuminated via the illumination device is projected in this case via the projection lens onto a substrate (for example a silicon wafer) that is coated with a light-sensitive layer (photoresist) and arranged in the image plane of the projection lens in order to transfer the mask structure to the light-sensitive coating of the substrate.

In projection lenses designed for the EUV range, which is to say at wavelengths of for example approximately 13 nm or approximately 7 nm, mirrors are usually used as optical components for the imaging process owing to the general lack of availability of suitable light-transmissive refractive materials.

Absorption of the radiation emitted by the EUV light source among other reasons can cause the EUV mirrors heat up and undergo an associated thermal expansion or deformation, which in turn can adversely affect the imaging properties of the optical system.

Various approaches are known for avoiding surface deformations caused by heat inputs into an EUV mirror and optical aberrations associated therewith.

It is known inter alia to use a material with ultra-low thermal expansion ("Ultra Low Expansion Material"), for example a titanium silicate glass sold by Corning Inc. with the name ULE™, as the mirror substrate material and to set what is known as the zero-crossing temperature in an area near the optically effective surface. At this zero-crossing temperature, which lies at around $\vartheta=30°$ C. for example for ULE™, the coefficient of thermal expansion has in its temperature dependence a zero crossing in the vicinity of which no thermal expansion or only negligible thermal expansion of the mirror substrate material takes place.

Possible further approaches for avoiding surface deformations caused by heat inputs into an EUV mirror include the use of a heating arrangement, for example on the basis of infrared radiation. With such a heating arrangement, active mirror heating can take place in phases of comparatively low absorption of EUV used radiation, the active mirror heating being correspondingly decreased as the absorption of the EUV used radiation increases. One or more temperature sensors can be attached to the EUV mirror in this case, with the heating power introduced by the heating arrangement into the respective EUV mirror being controlled on the basis of a setpoint value for the temperature attained at the location of the relevant temperature sensor.

In practice, however, the temperature measured at the location of the respective temperature sensor can differ from the ultimately relevant temperature on the optical effective surface of the EUV mirror both on account of the use of illumination settings which have an intensity that varies over the optical effective surface of the mirror and on account of the circumstance that the temperature measured at the respective sensor location "trails" the actual surface temperature, with the result that the aforementioned control of the heating power ultimately might cause insufficient avoidance of undesired heat inputs and the surface deformations or optical aberrations accompanying this.

Reference is made, merely by way of example, to DE 10 2017 207 862 A1, DE 10 2013 204 427 A1 and DE 10 2017 205 405 A1.

SUMMARY

The present disclosure seeks to provide a method for heating an optical element in a microlithographic projection exposure apparatus, and an optical system, which enable effective avoidance of surface deformations caused by heat inputs into the optical element and optical aberrations accompanying this.

In a method for heating an optical element in a microlithographic projection exposure apparatus, a heating power is introduced into the optical element using a heating arrangement, with this heating power being controlled on the basis of a setpoint value, this setpoint value being varied over time during operation of the projection exposure apparatus, and the variation of the setpoint value for the heating power comprising a simulation of the respective effect of changes in the heating power in comparison with its actual value on the basis of a model for the thermal behavior of the optical element.

The disclosure involves the concept of realizing dynamic closed-loop control of the heating power introduced into an optical element in a microlithographic projection exposure apparatus by a heating arrangement on the basis of a setpoint value variably set over time during operation of the relevant projection exposure apparatus, in order thus to account for different operating states of the optical system or projection exposure apparatus or to take into account the information available in this respect during the operation of the optical system.

The disclosure includes the concept of determining, in model-aided fashion, effects of changes in the heating power introduced into the optical element by the heating arrangement in comparison with the respective (actual) values and then, depending on the effects determined thus, optionally specifying new heating power setpoint values for the closed-loop control during the operation of the optical system. In this case, the aforementioned effects of changes in the heating power may relate for example to the respective wavefront properties of the optical system (e.g., the wavefront provided in the image or wafer plane of the projection lens of a microlithographic projection exposure apparatus). Furthermore, the model-aided determination of effects of a change in the respective heating power may comprise the implementation of an optical forward propagation for the relevant optical system.

Moreover, the wavefront provided by the optical system in a specific plane (for example in the wafer plane of a projection lens) can also be measured. For example, corresponding measurement results can be used for a calibration of the aforementioned forward propagation or the model.

As a result, the closed-loop control according to the disclosure of the heating power, which is based on setpoint values that vary over time during operation of the optical system, can be used for a dynamic adaptation of the respective heating process to the actually present and fluctuating operating states of the optical system, with for example an online simulation of the thermal state and its propagation into the future in each case being able to be carried out.

According to an embodiment, the setpoint value is varied taking into account an illumination setting currently set in the projection exposure apparatus.

According to an embodiment, the setpoint value is varied taking into account a reticle currently used in the projection exposure apparatus.

According to an embodiment, the setpoint value is varied on the basis of a measurement of an intensity distribution currently present in a predetermined plane of the projection exposure apparatus.

According to an embodiment, the model is created taking into account a known spatial distribution of the zero crossing temperature in the material of the optical element.

According to an embodiment, the model is generated using an artificial intelligence method, with the model being trained using a multiplicity of training data in a learning phase and the training data each comprising values of the heating power and wavefront properties of projection exposure apparatus assigned to these values.

According to an embodiment, these training data are provided at least in part on the basis of a model-based simulation of the wavefront properties to be expected for different operating conditions of the projection exposure apparatus.

According to a further embodiment, the training data are provided at least in part on the basis of wavefront properties previously measured in the projection exposure apparatus for different operating conditions.

According to an embodiment, the optical element is heated in such a way that a spatial and/or temporal variation of a temperature distribution in the optical element is reduced.

According to an embodiment, the optical element is heated in such a way that an optical aberration caused elsewhere in the projection exposure apparatus is at least partly compensated.

According to an embodiment, the optical element is a mirror.

According to an embodiment, the optical element is designed for an operating wavelength of less than 30 nm, such as less than 15 nm.

The disclosure also relates to an optical system of a microlithographic projection exposure apparatus, having at least one optical element, a heating arrangement for heating this optical element, and a control unit for closed-loop control of the heating power introduced into the optical element by the heating arrangement on the basis of a setpoint value, this setpoint value being varied over time during operation of the optical system and the variation of the setpoint value for the heating power comprising a simulation of the respective effect of changes in the heating power in comparison with its actual value on the basis of a model for the thermal behavior of the optical element.

In an embodiment, the optical system is configured to carry out a method having the above-described features. With regard to certain aspects and further configurations of the optical system, reference is made to the above explanations in association with the method according to the disclosure.

Further configurations of the disclosure are evident from the description and the dependent claims.

BRIEF DESCRIPTION OF THE DRAWINGS

The disclosure is explained in greater detail below on the basis of exemplary embodiments illustrated in the accompanying figures, in which.

DETAILED DESCRIPTION

Figure 1:
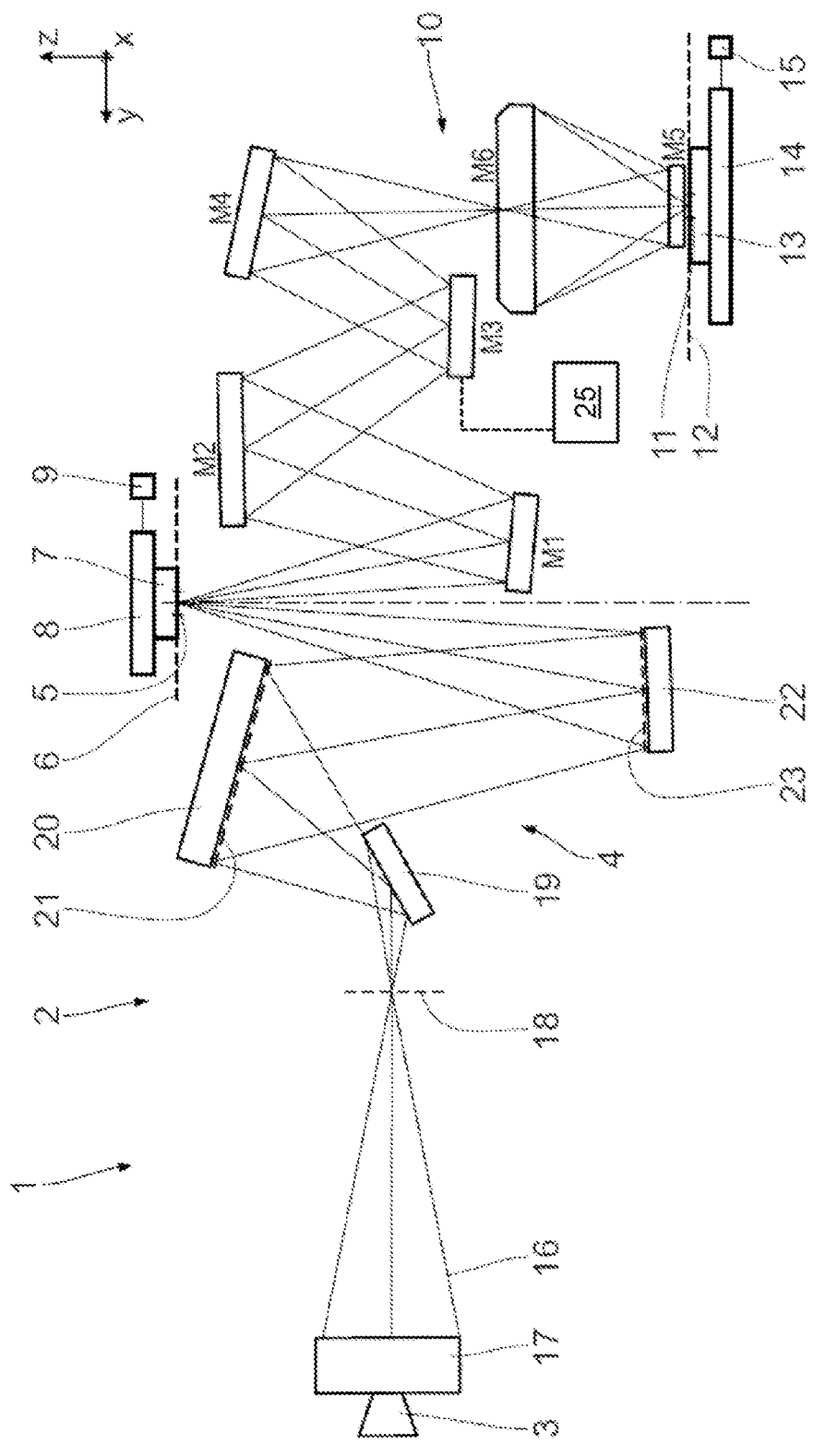
FIG. 1 shows a schematic illustration of a possible structure of a microlithographic projection exposure apparatus designed for operation in the EUV.

FIG. 1 shows a schematic illustration of a projection exposure apparatus 1 which is designed for operation in the EUV and in which the disclosure is realizable by way of example.

According to FIG. 1, the projection exposure apparatus 1 comprises an illumination device 2 and a projection lens 10. The illumination device 2 serves to illuminate an object field 5 in an object plane 6 with radiation from a radiation source 3 by way of an illumination optical unit 4. Here, a reticle 7 arranged in the object field 5 is exposed. The reticle 7 is held by a reticle holder 8. The reticle holder 8 is displaceable, for example in a scanning direction, by way of a reticle displacement drive 9. For explanation purposes, a Cartesian xyz-coordinate system is shown in FIG. 1. The x-direction runs perpendicular to the plane of the drawing into the latter. The y-direction runs horizontally, and the z-direction runs vertically. The scanning direction runs along the y-direction in FIG. 1. The z-direction runs perpendicularly to the object plane 6.

The projection lens 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example longitudinally with respect to the y-direction. The displacement, firstly, of the reticle 7 by way of the reticle displacement drive 9 and, secondly, of the wafer 13 by way of the wafer displacement drive 15 can be implemented so as to be mutually synchronized.

The radiation source 3 is an EUV radiation source. The radiation source 3 can emit EUV radiation, which is also referred to below as used radiation or illumination radiation. For example, the used radiation has a wavelength in the range between 5 nm and 30 nm. The radiation source 3 can be for example a plasma source, a synchrotron-based radiation source or a free electron laser (FEL). The illumination radiation 16 emanating from the radiation source 3 is focused by a collector 17 and propagates through an intermediate focus in an intermediate focal plane 18 into the illumination optical unit 4. The illumination optical unit 4 comprises a deflection mirror 19 and, arranged downstream thereof in the beam path, a first facet mirror 20 (having schematically indicated facets 21) and a second facet mirror 22 (having schematically indicated facets 23).

The projection lens 10 comprises a plurality of mirrors Mi (i=1, 2, . . . ), which are consecutively numbered according to their arrangement in the beam path of the projection exposure apparatus 1. In the example illustrated in FIG. 1, the projection lens 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection lens 10 is a doubly obscured optical unit. The projection lens 10 has an image-side numerical aperture which, merely by way of example, may be greater than 0.3, and for example may also be is greater than 0.5 and more particularly greater than 0.6.

During operation of the microlithographic projection exposure apparatus 1, the electromagnetic radiation incident on the optically effective surface of the mirrors is partially absorbed and, as explained in the introduction, results in heating and an associated thermal expansion or deformation, which in turn can result in an impairment of the imaging properties of the optical system. Respective active mirror heating using a pre-heater can now take place in phases of comparatively low absorption of used EUV radiation as described at the outset, with the active mirror heating being correspondingly decreased as the absorption of the used EUV radiation increases.

According to the present disclosure, the heating power, which is introduced into at least one of the mirrors by a corresponding heating arrangement, is now controlled on the basis of a setpoint value that varies over time during the operation of the optical system or projection exposure apparatus. Different operating states of the optical system are accounted for in this way, with information available during the operation of the optical system (e.g., an illumination setting currently set in the projection exposure apparatus or a reticle currently used in the projection exposure apparatus) being taken into account.

A heating arrangement is shown only schematically in FIG. 1 and denoted by "25", with this heating arrangement 25 being used to introduce a heating power into the mirror M3 in the example. In this case, the disclosure is not further restricted with regard to the way in which heating power is introduced or the configuration of the heating arrangement used to this end. Purely by way of example, the heating power can be introduced in a manner known per se by way of infrared radiators or else by way of electrodes to which a voltage can be applied and which are arranged on the optical element or mirror to be heated.

Furthermore, the disclosure is not further restricted with regard to the number of optical elements or mirrors to be heated, with the result that the closed-loop control according to is the disclosure can be applied to the heating of only a single optical element or else to the heating of a plurality of optical elements.

Figure 2:
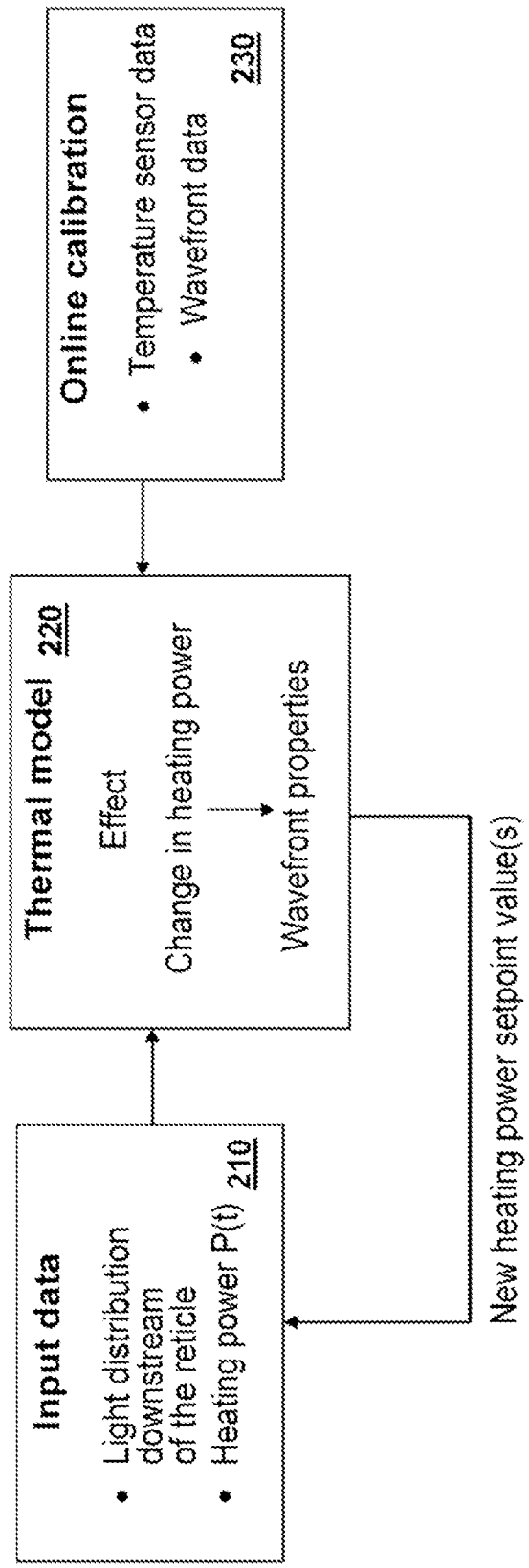
FIG. 2 shows a much simplified diagram for explaining a basic possible procedure of a method according to the disclosure for heating an optical element.

FIG. 2 initially shows a much simplified diagram for explaining an exemplary embodiment of a method according to the disclosure.

According to FIG. 2, the effects of changes in the heating power in comparison with the respective actual value with regard to the wavefront properties provided by the optical system are determined by simulation "online", or during the operation of the optical system, in a block 220 in model-based fashion (i.e., on the basis of a "thermal model" which simulates the thermal state of the optical element or mirror). This determination by simulation of the respective effects of changes in the heating power is carried out according to FIG. 2 on the basis of input data provided in a block 210, the input data comprising both the light distribution present downstream of the reticle in relation to the optical beam path and the current heating power P(t) radiated-in by the heating arrangement. For example, the thermal model can be created taking into account a known spatial distribution of the zero-crossing temperature (="zero crossing temperature") in the material of the optical element.

A determination of the effects of a change in the respective heating power, carried out in block 220, may comprise for example a model-based optical forward propagation in the optical system, for which in turn, according to block 230, an online calibration can be carried out on the basis of temperature sensor data (e.g., from at least one temperature sensor located on the respective optical element or mirror) and wavefront data (e.g., from a wavefront sensor located in the region of the wafer plane).

Figure 3:
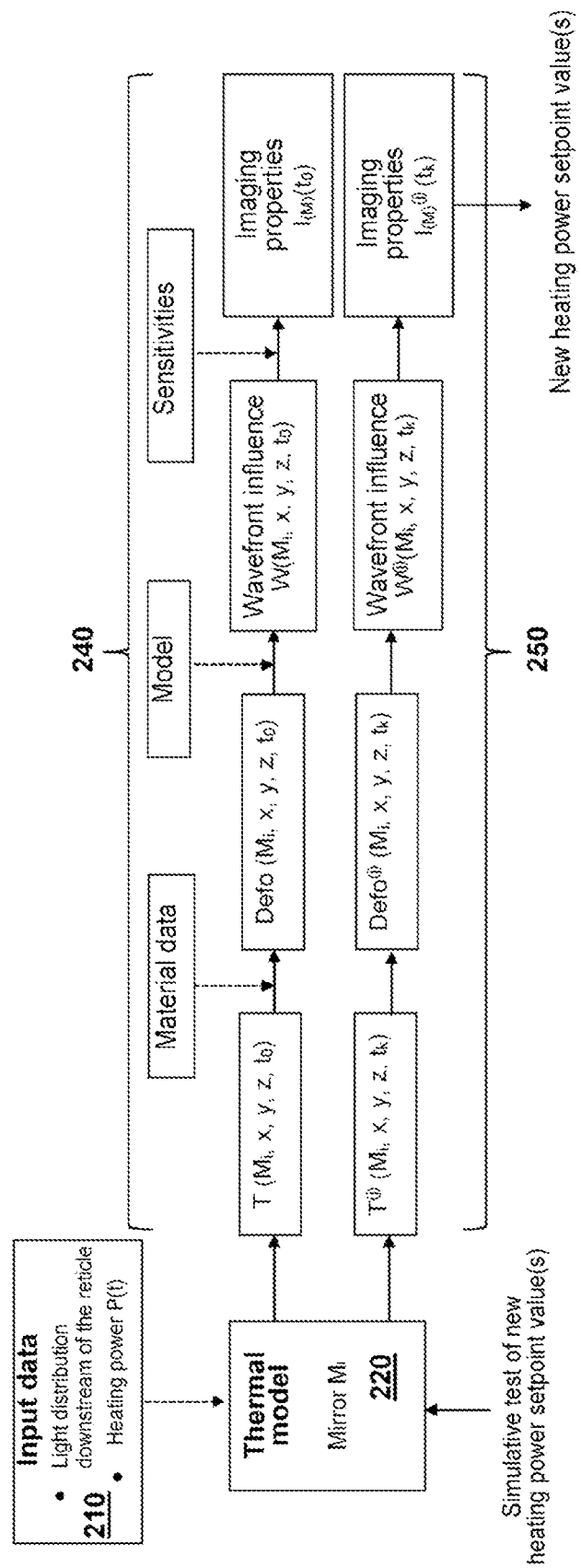
FIG. 3 shows a diagram for explaining a possible procedure of the model-based online simulation for determining new heating power setpoint values, carried out in the method according to FIG. 2.

FIG. 3 shows a diagram for a more detailed explanation of the model-based determination, implemented within the method according to the disclosure, of respective new heating power setpoint values during the operation of the optical system.

According to FIG. 3, the respective temperature distribution, the resulting deformation, the wavefront influence resulting in turn, and the resulting imaging properties are determined on the basis of the aforementioned input data according to block 210 using the thermal model used as a basis according to block 220. According to FIG. 3, this is implemented both in a reference path 240 (the upper path in FIG. 3) and in a comparison path 250 (the lower path in FIG. 3). While an optical forward propagation for the existing parameters $(M_i,x,y,z,t_0)$ is carried out in the reference path 240, the respective forward propagation for correspondingly changed parameters $(M_i,x,y,z,t_k)$ is carried out in the comparison path 250 in accordance with the simulative test of changed heating power setpoint values. As a result of the process carried out, new heating power setpoint values are output and used as a basis for controlling the heating arrangement.

Alternatively, the process can also be carried out only by selecting the best parameters in the comparison path with regard to a merit function, which is to say without explicit simulation of the reference path. The merit function can for example minimize the wavefront aberration W or certain properties of the wavefront that are particularly relevant to the respective application, such as coma or astigmatism. If the wavefront itself is enhanced (e.g., optimized), the last step shown in FIG. 3 of calculating imaging properties on the basis of the wavefront is not necessary. However, the wavefront itself is frequently not the most relevant application variable, but rather the imaging properties resulting from the wavefront. These can be, for example, effects on the structure size of the relevant structures imaged on the wafer (often denoted "CD"="critical dimension") or effects on the positioning of the structures (i.e., influence on the "overlay"). This influence can be calculated from the wavefront using simulation models or, for example, using sensitivities to wavefront aberrations determined in advance. Such aberrations are typically minimized using the merit function.

In embodiments, the thermal model used as a basis for the determination of effects of changes in the respective heating power can be generated using an artificial intelligence method, with the model being trained using a multiplicity of training data during a learning phase. This training data can respectively comprise values for the heating power and wavefront properties of the projection exposure apparatus associated with these values and can be provided on the basis of a model-based simulation of the wavefront properties to be expected for different operating states of the projection exposure apparatus and/or on the basis of wavefront properties measured in the projection exposure apparatus for different operating states in the past. In order to generate suitable training data by way of measurements on the projection exposure apparatus, targeted "calibration measurements", for example, can be carried out during the start-up of the apparatus, during which measurements parameter combinations considered representative for the later application are varied. Training with the aid of measurements can be used, for example, if a sufficiently accurate simulation is not available. For example, this could be due to the available simulation model itself or else due to a limited accuracy of the included conditions (e.g., knowledge of the real material properties or thermal ambient conditions of the mirror). Training with simulation data, by contrast, has the particular advantage that no measurement time is required on the apparatus and conditions that cannot be generated on the apparatus at the time of training can be modeled. In the learning phase, a combination of initial training with data generated in a simulation and subsequent training with measurement data from the apparatus itself, for example, can combine the advantages of both training methods. The use of artificial intelligence is attractive, for example, because the process of the heating power in the present disclosure can take place during the operation of the apparatus with a high throughput ("online"). This results in demanding desired properties in relation to the time used for the process, which can be met by the acceleration potential that is typical in the application phase of artificial intelligence (e.g., in comparison with complex physical simulations).

Although the at least one optical element or mirror is heated in one application of the disclosure in order to reduce a spatial and/or temporal variation in a temperature distribution in the optical element, or reduce thermally induced deformations accompanying this, the disclosure is not restricted thereto. In further embodiments, the at least one optical element or mirror can thus also be heated in order to at least partly compensate for an optical aberration caused elsewhere in the projection exposure apparatus.

Even though the disclosure has also been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the appended patent claims and the equivalents thereof.

What is claimed is:

1. A method, comprising:
    using a heating arrangement to introduce a heating power into an optical element in a microlithographic projection exposure apparatus, the optical element comprising a temperature sensor, the heating power being controlled based on a setpoint value for a temperature attained at a location of the temperature sensor;
    measuring wavefront data of the microlithographic projection exposure apparatus;
    modelling wavefront properties of the microlithographic projection exposure apparatus;
    comparing the measured wavefront data to the modelled wavefront properties; and
    based on the comparison of the measured wavefront data and the modelled wavefront properties, varying a setpoint value for the temperature attained at the location of the temperature sensor during operation of the projection exposure apparatus, thereby varying the heating power.

2. The method of claim 1, comprising varying the setpoint value taking into account an illumination setting currently set in the projection exposure apparatus.

3. The method of claim 1, comprising varying the setpoint value taking into account a reticle currently used in the projection exposure apparatus.

4. The method of claim 1, comprising varying the setpoint value based on a measurement of an intensity distribution currently present in a predetermined plane of the projection exposure apparatus.

5. The method of claim 1, comprising generating the model taking into account a known spatial distribution of a zero crossing temperature in a material of the optical element.

6. The method of claim 1, comprising generating the model using an artificial intelligence method, wherein the model is trained using a multiplicity of training data in a learning phase, and each training datum comprises values of the heating power and wavefront properties of projection exposure apparatus assigned to the values.

7. The method of claim 6, wherein the training data are at least partially based on a model-based simulation of the wavefront properties to be expected for different operating conditions of the projection exposure apparatus.

8. The method of claim 6, wherein the training data are at least partially based on wavefront properties measured in the projection exposure apparatus for different operating conditions.

9. The method of claim 1, comprising heating the optical element to reduce a spatial and/or temporal variation of a temperature distribution in the optical element.

10. The method of claim 1, comprising heating the optical element to at least partially compensate an optical aberration caused elsewhere in the projection exposure apparatus.

11. The method of claim 1, wherein the optical element comprises a mirror.

12. The method of claim 1, comprising operating the microlithographic projection exposure apparatus using an operating wavelength of less than 30 nm.

13. The method of claim 1, wherein varying the setpoint value for the temperature attained at the location of the temperature sensor comprises a simulation of respective effect of changes in the heating power on a wavefront provided by the projection exposure apparatus in an image or wafer plane of a projection lens of the microlithographic projection exposure apparatus.

14. The method of claim 1, comprising, for a model-aided determination of effects of a change in the heating power, implementing an optical forward propagation for the projection exposure apparatus.

15. The method of claim 14, comprising using a measurement of a wavefront provided in a plane of the projection exposure apparatus to calibrate the forward propagation or the model.

16. A method of manipulating a temperature of an optical element in a microlithographic projection exposure apparatus, the optical element comprising a temperature sensor, the method comprising:

varying a setpoint value of a temperature attained at a location of the temperature sensor during operation of the projection exposure apparatus based on a comparison of a simulation of a respective effect of changes in the heating power with its actual value with regard to the wavefront properties provided by the projection exposure apparatus based on a model of thermal behavior of the optical element; and using the setpoint value to control heating power that is introduced into the optical element.

17. The method of claim 16, wherein varying the setpoint value of the temperature attained at the location of the temperature sensor comprises a simulation of respective effect of changes in the heating power on a wavefront provided by the projection exposure apparatus in an image or wafer plane of a projection lens of the microlithographic projection exposure apparatus.

18. The method of claim 16, comprising, for a model-aided determination of effects of a change in the heating power, implementing an optical forward propagation for the projection exposure apparatus.

19. The method of claim 18, comprising using a measurement of a wavefront provided in a plane of the projection exposure apparatus to calibrate the forward propagation or the model.

20. An optical system, comprising:

an optical element comprising a temperature sensor;

a heating arrangement configured to heat the optical element; and a control unit configured to provide closed-loop control of the heating power introduced into the optical element by the heating arrangement based on a setpoint value for a temperature at a location of the temperature sensor, wherein:

the setpoint value is variable over time during operation of the optical system;

the variation of the setpoint value comprises a simulation of a respective effect of changes in the heating power in comparison with its actual value with regard to the wavefront properties provided by the optical system based on a model for the thermal behavior of the optical element; and the optical system is an optical system of a microlithographic projection exposure apparatus.

* * * * *